United States Patent [19]

Wagner

[11] 4,013,878
[45] Mar. 22, 1977

[54] DEVICE FOR AN ITERATIVE DETERMINATION OF THE VARIATION OF A FUNCTION IN A PLANE

[75] Inventor: Wolfgang Wagner, Norderstedt, Germany

[73] Assignee: U.S. Philips Corporation, New York, N.Y.

[22] Filed: Sept. 16, 1975

[21] Appl. No.: 613,813

[30] Foreign Application Priority Data

Sept. 24, 1974 Germany .......................... 2445482

[52] U.S. Cl. ....................... 235/151.35; 250/363 S
[51] Int. Cl.² ..................... G01T 1/00; G06F 15/42
[58] Field of Search ..................... 235/151.35, 198; 250/306, 307, 312, 315, 320, 321, 327, 358 R, 363 S; 178/DIG. 5, 7.8; 340/366 CA; 315/9, 76

[56] References Cited

UNITED STATES PATENTS

| | | | |
|---|---|---|---|
| 3,829,688 | 8/1974 | Barrett | 250/363 S |
| 3,871,579 | 3/1975 | Inamura | 235/198 |
| 3,916,198 | 10/1975 | Coltman et al. | 250/363 S |

Primary Examiner—Edward J. Wise
Attorney, Agent, or Firm—Frank R. Trifari; George B. Berka

[57] ABSTRACT

A device for iterative determination of the absorption distribution from the measuring values obtained by means of a scanner, which utilizes a storage tube whereon a charge image is stored which represents the distribution in a rough approximation. This charge image is read along strips whose orientation corresponds to that of the scanning during the measurement and is compared with the measuring values stored in a store. If a difference is detected, the charge on the charge strip is changed accordingly.

9 Claims, 4 Drawing Figures

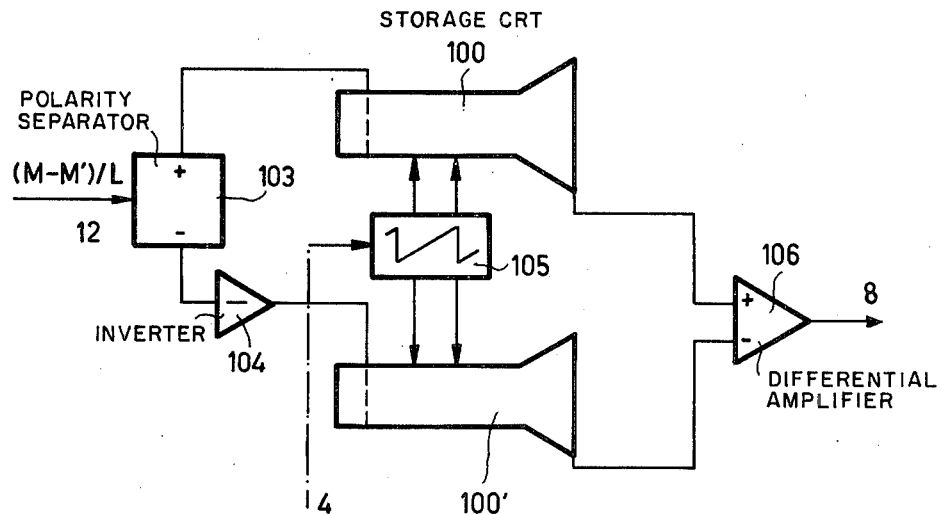
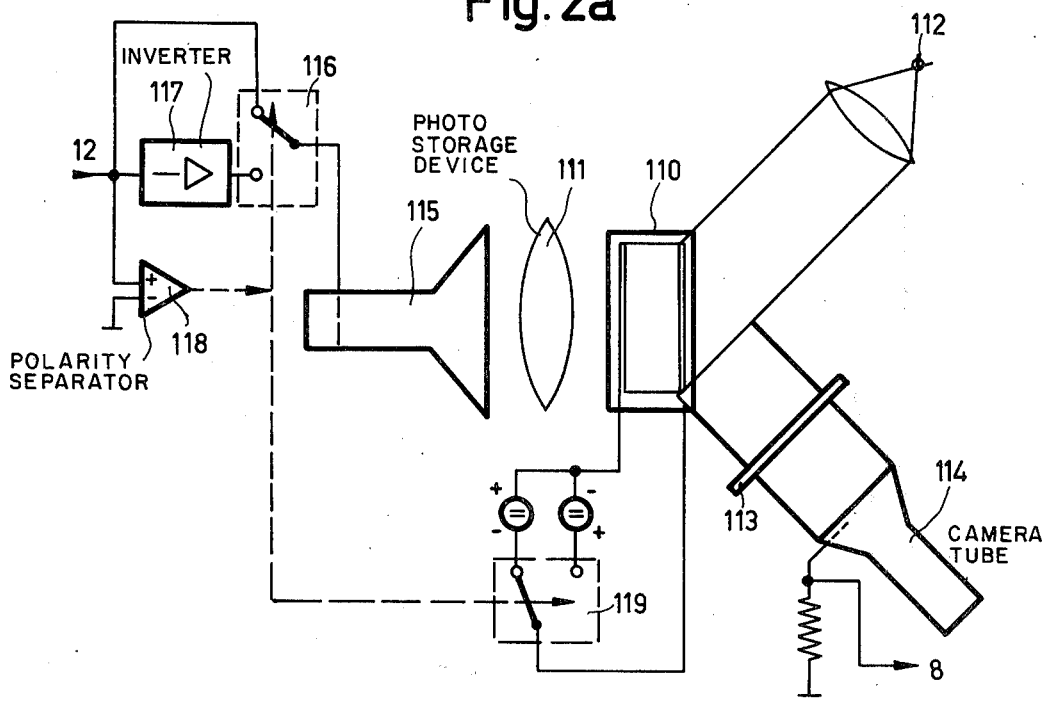

DEVICE FOR AN ITERATIVE DETERMINATION OF THE VARIATION OF A FUNCTION IN A PLANE

The invention relates to a device for an iterative determination of the shape of a function in a plane from (primary) integral values of this function measured along a large number of strips which scan the plane and which are differently orientated in groups, a variation of the function measured during a first step being used to determine the integral of the measured function values along strips, the said integral being compared with the primary integral values of the function associated with these strips, the variation of the function measured during the first step being corrected in accordance with the difference obtained during this comparison.

A device of this kind is known, from example, from German Offenlegungsschrift No. 1,941,433. The device described therein serves for the measurement of the absorption or the density in a plane of a body, the primary integral values being obtained by measurement of the absorption of the body (ratio between the intensity of the radiation applied to the body and the intensity of the radiation measured behind the body) and by the logarithm calculation of this measuring value. The spatial distribution of the absorption or density in the body is determined by approximation during a first step. So as to improve this approximation, the absorption or density is integrated along a strip and compared with the measuring value obtained for this strip (= primary integral value of the function). If the value obtained by integration along the strip does not equal the measuring value or the primary integral value, the values measured by approximation along the relevant strip are corrected in accordance with this difference. This is repeated for all strips (approximately 10,000 strips in practice) along which the absorption has been measured. An absorption distribution is then obtained which usually represents a better approximation of the actual distribution than the distribution first measured. This apprroximation can again be improved by repeating the described calculating method, so that after several of such iteration steps the spatial distribution of the absorption or the density in the plane examined has been properly approximated.

In the known device a suitably programmed digital computer is used for measuring the spatial distribution of the absorption of the density in the plane examined. This requires a calculating time of a few minutes and a large number of storage locations.

The invention has for its object to provide a device of the kind set forth whereby the described iteration steps can be quickly performed with little effort, notably using only a small number of storage locations. To this end, a device of the kind set forth according to the invention is characterized in that there are provided a cathode ray tube device including a charge-storing target whereon a charge image corresponding to the spatial variation of the function obtained during the first step can be stored, means for reading the charge image along the strips, an integration stage for the integration of the values read, a circuit which forms the difference between this value and the primary integral value of the function which is associated with this strip and which is stored in a store, and a device for changing the charge density of the strip in proportion to the difference.

It is assumed that on the target of the cathode ray tube device a charge image is stored which represents a first approximation of the (surface-wise) variation of the function, assuming that the function values are proportional to the charge density. The method of obtaining this first charge image is not the subject of this application. For this purpose use can be made of the calculating method known from the German Offenlegungsschrift No. 1,941,433, but also of the method described in applicant's U.S. Pat. application Ser. No. 610,445 filed Sept. 4, 1975.

The most important aspect of the invention is formed by the cathode ray tube device comprising a charge-storing target whereon the variation of the function in the plane is displayed as a charge image. If this charge image is read (without interference) along a strip, the instantaneous value of the signal of the charge density is proportional in the location read each time. If this signal is integrated (in time), a value is obtained which is proportional to the integral of the charge density on this strip or the charge on this strip. The difference between this integral value and the primary integral value (which can be obtained, for example, by measuring the absorption in the plane of the object) is larger when the charge image deviates more from the actual variation of the function (absorption). Therefore, an additional charge (of constant density) is superimposed on the charge distribution already present on the strip, the said additional charge being proportional to the difference between the primary integral value obtained by measurement and the integral value produced by the said integration.

The function of the digital computer in the known device is thus mainly taken over by the cathode ray tube device comprising the target suitable for storage. As a result, the device according to the invention is substantially cheaper. Moreover, the calculating time is reduced to a few seconds.

The invention will be described in detail hereinafter with reference to an embodiment according to the invention which is shown in the drawing.

FIGS. 2a and 2b show different embodiments of the cathode ray tube device, and

Figure 1:
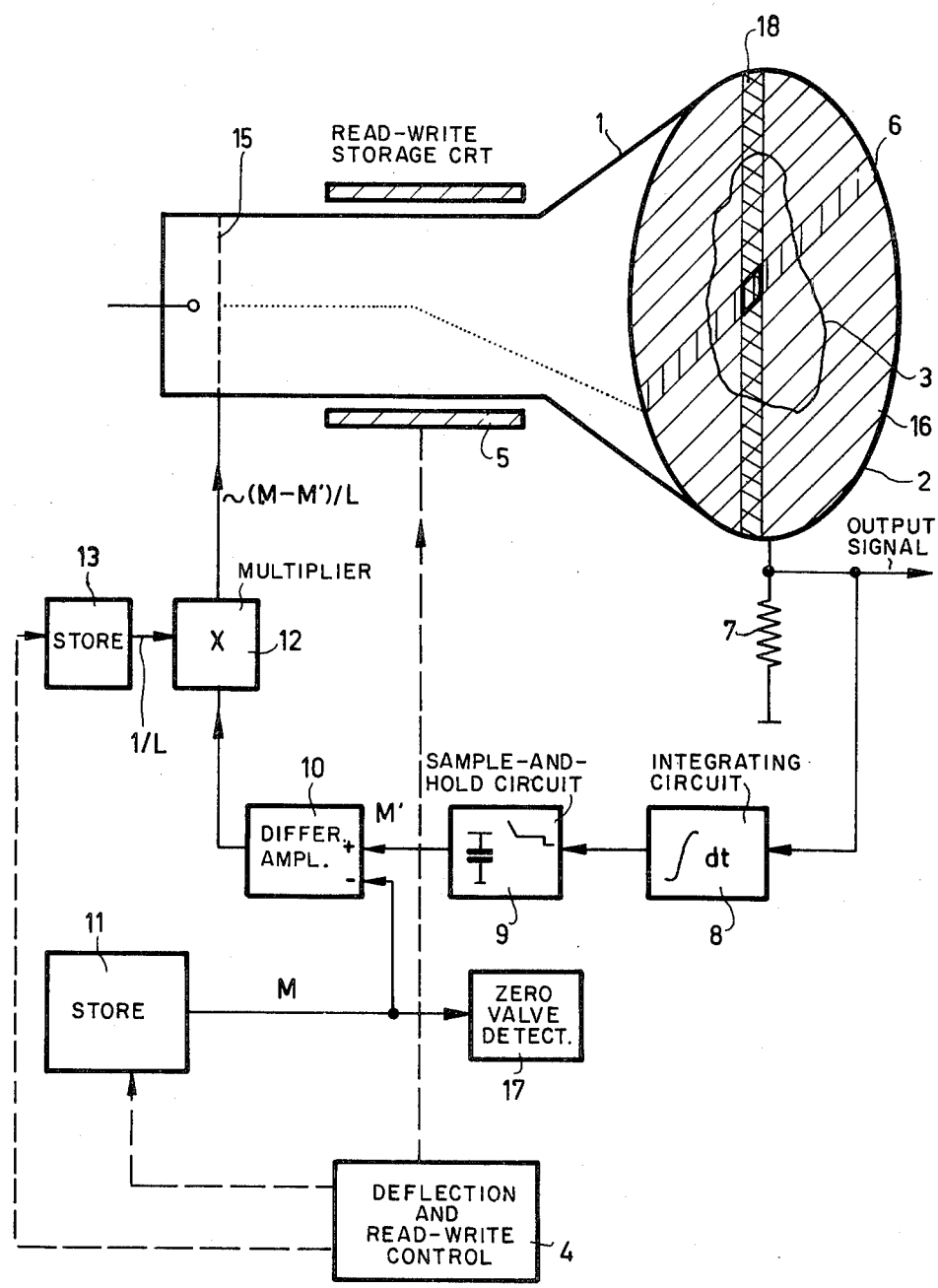
FIG. 1 shows a block diagram of a device according to the invention.

The cathode ray tube device is denoted by the reference 1 in FIG. 1. In this embodiment the device comprises a storage tube, on the target of which charge distributions can be stored. Tubes of this kind are known, for example, from "Electronics," Feb. 15, 1973, page 91 and further. As is denoted by the contour line 3, on the target 2 of the charge storage tube there is present a charge image which repesents an approximation of the variation of the function (for example, of the absorption) in the plane of the body examined.

As has already been stated, the formation of this first approximative image is not the subject of this application. The formation can be effected, for example, in that the absorption is approximately calculated, one point of the plane after the other, the electron beam deflected in accordance with the position of each relevant point being modulated by the value found for this point, so that in the location on the target assigned to this point a charge is written whose density is proportional to the function value.

Subsequently, the charge distribution must be stripwise read, for which purpose the direct voltage on the target must be changed in the correct manner. A control section 4 influences the deflection 5 of the storage tube such that the charge on a strip is scanned according to a predetermined position and direction, the focussing being adjusted such that the half-value width of the electron beam corresponds approximately to one strip width. On the resistor 7 a signal is thus produced having an amplitude which is proportional to the charge density on the part of the strip each time scanned. This signal is applied to an integrator 8 which forms the time integral of these instantaneous values, the output of the said integrator being connected to a so-termed sample-and-hold circuit 9 which stores the integral value M' obtained after the scanning of a complete strip. The integral value M' stored is applied to one input of a differential amplifier 10. The control section 4 controls a store 11 wherein the primary integral values M are stored (the primary integral values may be, for example, measuring values obtained from the measurement of the absorption, i.e. from the ratio between the intensity of radiation before and behind a body examined) such that to the other input of the differential amplifier 10 each time the primary integral value is applied which has the same position and direction with respect to the plane examined as the strip 6 with respect to the charge image 3.

In the ideal case, i.e. if the charge image were to represent the variation of the function in the plane exactly, the values M and M' would be equal, so that the signal O would be present on the output of the amplifier 10. However, because the charge image represents only an approximation, the values M and M' are usually different, so in these cases a signal is obtained on the output of the differential amplifier which is proportional to this difference. This output signal is applied to the one input of a multiplier circuit 12, the other input of which, under the control of the control section 4, receives a signal from the store 13 which is proportional to the reciprocal value of the length L of the strip scanned. Therefore, on the output of the multiplier circuit a signal is present which is a measure for the deviation of the charge image along the strip scanned, from the actual variation of the function in the plane. Consequently, on the charge distribution already present on the strip 6 a quantity of charge is superimposed — uniformly distributed — which is proportional to this signal with respect to the strip surface.

To this end, the storage tube 1 is switched over to "writing" operation by the control section 4, and the output signal is applied to the control grid of the storage tube, so that the intensity of the electron beam is proportional to the voltage present on the grid. Consequently, when the electron beam is passed over the strip 6 at constant speed, the density of the charge provided thereon is also proportional to the output signal of the multiplier stage 12. Subsequently, the storage tube is switched over to "read" operation again, and the charge present on the strip extending parallel to the strip 6 is scanned, the described operation then being repeated. This operation is performed for all parallel extending strips. Subsequently, the scanning is repeated along strips which enclose a different angle with the target 2 or the charge image 3 and which intersect the already corrected strips. If the charge distribution is corrected along such a strip (FIG. 1 shows only one strip 18), therefore, the charge density at the intersection of the strips 6 and 18 also changes. The correction of the charge distribution on strips scanned at a later stage thus also changes the charge on the already corrected strips. Consequently, after the charge image has been scanned in all directions in the described manner, a new iterative cycle is required, the charge distribution then being corrected again in the described manner.

So as to improve the iteration process, a zero value detector 17 is provided which, when the primary integral value M read from the store 11 has the value zero (for example, using the system for measuring the absorption in a body this is always the case if the absorption was measured outside the body, approximately along the strip 16 ) always erases the charge on the strip, so that the charge thereon is also zero.

It is important that when a strip is read, the information each time present in the strip in the form of the charge distribution is not lost. Therefore, use would have to be made of a storage tubes permitting interference-free reading. However, storage tubes where this is not possible can alternatively be used, if the signal produced on the resistor 7 during reading is applied to an intermediate store, for example, in the form of a further storage tube, the said signal being written on the strip again after termination of the reading process.

The differences between the values M and M' can usually be either positive or negative. This means that during the superimposition charges have to be added to or subtracted from the charges already present on a strip. This is in principle possible in a storage tube, because these tubes have the property that in the case of a high voltage between cathode and target of the electron beam, the positive charge on the target increases (because each incident electron releases several secondary electrons which are attracted by a grid not shown, so that a positive charge appears on the target), and that in the case of a small voltage between cathode and target of the electron beam, the positive charge on the target decreases, because no secondary electron is emitted for each incident electron. Therefore, the voltage on the target should be switched over between a higher and a lower value in accordance with the sign of the output signal of the multiplier circuit 12 in a manner not shown. Moreover, the output of the multiplier circuit 12 should not be directly connected to the control grid 15, but the output signal should rather be applied (not shown in the drawing) to a circuit which, for the one polarity of the output signal applies this signal directly to the grid, while for the opposite polarity the output signal is applied to the grid via an inverting amplifier. If the gain of this inverting amplifier is suitably chosen, it can be achieved that the charge variation on the target is independent of the sign of the output voltage of the multiplier circuit 12 and proportional to the value thereof.

FIG. 2a shows a cathode ray tube device which is equivalent to the storage tube described with reference to FIG. 1. This cathode ray device comprises two storage tubes 100 and 100' of identical construction, the electron beam thereof being synchronously passed over the target by means of the deflection unit 105 which is controlled in common by the control section 4. The control grids of the storage tubes are connected to a polarity separation circuit 103 which applies signals of positive polarity directly to the control grid of the storage tube 100 and signsls of negative polarity, via an inverting amplifier 104 having a gain factor 1, to the grid of the storage tube 100'. When the output signal of the multiplier stage 12 is written, either the charge on the target of the storage tube 100 or that on the target of the storage tube 100' is changed, depending on the polarity of the output signal. The amount and the sign of this charge variation are independent of the sign of the output signal of the multiplier stage 12. During reading, the two targets are synchronously scanned and the signals resulting from their charge distribution are applied to a differential amplifier 106. The device then operates as if the charge on the target of the storae tube 100' were subtracted from the charge on the target of the storage tube 100.

Because the charges on the storage tubes 100 and 100' are continuously increased during the iteration process, it must be ensured that the charge in a location on the target of one of the two tubes 100 or 100' does not exceed the maximum permissible value, i.e. the saturation value, in the course of the further iterations, as otherwise errors will occur in the image calculation. Therefore, after each iteration cycle both tubes are preferably line-wise read. Each line read is introduced into a linear shift register via the differential amplifier 106 and, after the charges of this line on the targets of the two tubes have been erased, the contents of the shift register are written, via the polarity separation circuit 103, on the same line of the two targets again. The same is continuously effected for all lines. It is thus achieved that after the termination of this process, only the differential values of the charge distribution are stored on the two targets. However, this process can be dispensed with if the below reading operation is performed.

FIG. 2b shows a device which is equivalent to the storage tube described with reference to FIG. 1 and wherein a photo Titus tube 110 is used. A tube of this kind enables the storage of an optical image applied to the input thereof via an optical system 111. The charge distribution is influenced on a dielectric mirror arranged in the photo Titus tube in accordance with the brightness of the optical image. The polarity of the charges stored is dependent of the polarity of the direct voltage applied between the two outer transparent electrodes. For reading the charge image stored, the output side of the photo Titus tube is exposed to a source 112 of linearly polarized light. The light is reflected by the dielectric mirror, the latter being rotated in the polarization direction thereof in accordance with the sign and the amount of the charge stored on the dielectric mirror. The rotation of the polarization direction is displayed by means of an analyser 113. The polarizer is followed by a television camera tube 114, the output signal of which is applied to the integration circuit 8 (FIG. 1).

The input side of the photo Titus tube 110 is connected, via the optical system 111, to the display screen of a video display tube 115. The intensity of the electron beam of the video display tube is modulated by the value of the output signal of the multiplier stage 12 (FIG. 1). Therefore, using a switch 116, the output signal is on the one hand applied directly to the modulation grid of the video display tube 115, and on the other hand it is applied thereto via an inverting amplifier 117. The switch 116 is controlled by a sign recognition circuit 118 such that the electron beam is each time proportional to the value of the output signal of the multiplier circuit 12. As a result, the brightness of the strip recorded on the display screen of the video display tube 115 is also proportional to the value of the output signal. Because the sign recognition circuit 118 switches over, via a further switch 119, the polarity of the direct voltage between the two outer electrodes of the photo titus tube 110 in accordance with the polarity of the output signal, it is achieved that the charge variation caused on the dielectric mirror of the photo Titus tube 110 by the brightness on the display screen of the video display tube 115 has a polarity which corresponds to the polarity of the output signal. The deflection of the electron beam of the video display tube 115 and of the camera tube 114 is effected in the same manner as described with reference to FIG. 2a and FIG. 1. For simplicity's sake, it is not shown in FIG. 2b.

Figure 3:
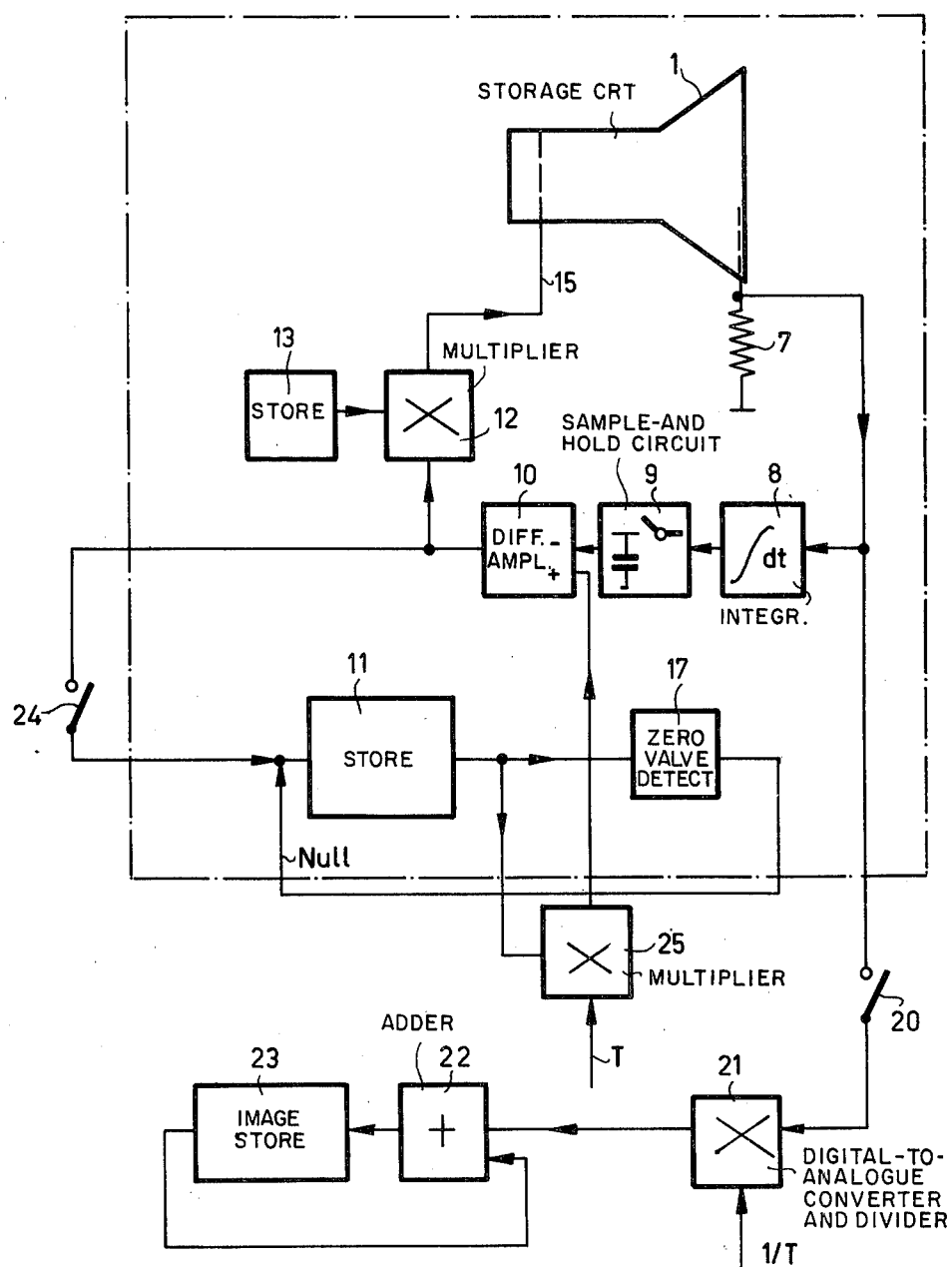
FIG. 3 shows an embodiment offering a high degree of accuracy.

In practice, the fact should be taken into account that a cathode ray tube device as described can process only signals of limited dynamic range. The limited dynamic range exists because of the fact that, on the one hand, the charge density on the target cannot be arbitrarily high and, on the other hand, that below a given charge density on the taret irregularities on the target surface as well as noise of the preamplifiers, processing the signal read from the target surface, can cover the signal. The noise is dependent of the bandwidth of the signals to be processed, and hence of the write and read speed of the cathode ray tube device. The dynamic range. however, also determines the accuracy of the device. A device includng a storage tube which allows, for example, only the processing of signals having a synamic range of 1:100, can in the most favourable case offer results with an accuracy of 1 %. In many cases the function values, for example, the absorption of X-radiation in tissue, must be determined at a higher accuracy. FIG. 3 shows a device which enables a higher accuracy to be achieved.

In this device it is assumed that the changes to be undergone by the charge image recorded on the target so as to represent exactly the variation of the function pursued, are substantially smaller than the charge densities at the areas where the change must take place. Therefore, if the target of the cathode ray tube device is used exclusively for measuring the changes, the signals to be processed can be amplified such that the overall useful dynamic range of the cathode ray tube device is available for these changes. This embodiment is shown in FIG. 3. The device comprises a section (enclosed by a stroke-dot line) which is identical to the device shown in FIG. 1; therefore, the same references are used for the individual elements. The processing of the first approximative charge image, therefore, is effected in the same manner as in the device described with reference to FIG. 1.

After one or more iteration cycles, however, a read operation is performed. To this end, the charge disturbution present on the target of the storage tube 1 is line-wise read, and the signals are applied, via the switch 20, to the analog input of a digital-to-analog converter divider 21. The number 1/T present on the digital input of the converter 21 is then 1. The product is written into an external image store via an adding circuit 22. This store can be a video disc store or, if the signals are converted into digital form, a digital disc store.

Subsequently, the electron beam reads the charge distribution along the strip again (for example, 6 in FIG. 1). The value M—M' present on the output of the differential amplifier 10 are applied, via the switch 24 which is then closed, to the input of the store 11 for the primary integral values and are stored instead of the present value M of this strip. In this manner the contents of the store 11 are successively replaced by the new values M—M'. When the signal read from the store is zero, however, the output signal of the differential amplifier is sort-circuited by the zero value detector and the value zero is stored. Subsequently, the charge distribution on the target of the image storage tube 1 is erased.

After completion of this read operation, a new charge distribution in accordance with the values M—M' stored in the store 11 is built up on the target of the image storage tube 1. To this end, the output signal of this store is multiplied by an even value $T_1 > 1$ by means of the multiplier circuit 25, and is applied to the one input of the differential amplifier 10. Because no signal is present on the other input of this amplifier (because the target has been erased), to output signal of the differential amplifier is proportional to the value $T_1 (M-M')$ and the write beam of the storage tube — corrected by the values present in the store 13— is modulated by this value. On the relevant strip each time a charge distribution is thus built up which is proportional to the value $T_1 (M-M')$.

After the charge distribution has thus been built up again in accordance with the stored differences M—M', a further iteration cycle (or cycles) is effected in the same manner as described with reference to FIG. 1.

The factor $T_1$ should be proportioned such, for example, $2 \leq T_1 \leq 10$, that the values resulting from $T_1 (M-M')$ are writhin the dynamic range which can still be processed by the tube. In this manner the entire dynamic range is available for the changes of the charge distribution during this further iteration cycle.

After completion of one or more iteration cycles, a second read operation is performed, the difference image then present on the target being superimposed on the image already present in the image store 23, the signal, however, being multiplied by the factor 1/T by the multiplier circuit 21 so as to cancel the multiplication by the factor T performed by the multiplier circuit 25.

Subsequently, the charge distribution M" then present on the target is again read, integrated and compared with the values M—M' present in the store 11, the difference signal then obtained being stored in the store instead of the values M—M' stored thus far. After the target has been erased again, a new charge distribution is built up using the values then present in the store 11, the contents of store 11 again be multiplied by a factor $T_2 > 1$. It is assumed that as the number of iterations and read operations increases, the approximation of the image present on the image storage tube 1 or in the image store 23 with respect to the function to be calculated improves, so that the changes necessary are smaller each time. The factorr $T_2$ should be chosen such that the product of $T_2$ and the difference values stored in store 11 does not exceed the dynamic range which can be handled by the storage tube.

As a result, the signal-to-noise ratio of the difference signals processed by the storage tube 1 is improved again (by the factor $T_2$).

During the renewed reading out, the fact should be taken into account that the charge distribution then present on the target of the storage tube 1 has not only been multiplied by the factor $T_2$ but also by the factor $T_1$ and that this multiplication must be cancelled in the multiplier stage 21, for example, by applying the reciprocal value of the product $T_1 = T_2$ to the one multiplier input.

To this end, ready-only semiconductor stores can be provided (in a manner not shown) wherein the value is stored whereby the signal to be written in the image store 23 must be multiplied so as to cancel the previous multiplication by $T_1 \times T_2 \ldots T_m$. The addressing of the values stored in this semiconductor store is effected by the control section shown in FIG. 3, which also supplies the numerical values $T_1, T_2, T_3$ for the multiplier stage 25 and, moreover, controls the image store 23.

What is claimed is:

1. A device for an iterative determination of the surfacewise distribution of a function which is derived from measuring values obtained by scanning a plane of measurement along a plurality of substantially parallel strips, and wherein the resulting primary integral values associated with each strip, are stored in a first store, comprising: a read-write storage cathode ray tube having a charge storing target whereon is stored a charge image of the distribution of the function obtained during a first approximation; means for integrating output signals from the target during the reading operation of the tube; means for sampling the integral signal from the integrating means according to the length of respective scanning strips and for holding the sampled integral values; differential means for comparing the sampled integral values with corresponding primary integral values retrieved from said first store; and control means for adjusting the density of charges in each scanning strip on said target in response and proportionally to the variations of the difference signal.

2. A device as claimed in claim 1, wherein the cathode ray tube device comprises a single storage tube whose writing beam intensity is controlled by said control means, and means for switching over the voltage between cathode and target from a higher value to a lower value in accordance with the polarity of the difference signal value.

3. A device as claimed in claim 1, wherein the cathode ray tube device comprises two storage tubes, the deflection systems of which are synchronously controlled with respect to each other, the electron beam of the one storage tube being modulated by the positive difference signal and the electron beam of the other storage tube being modulated by the negative difference signals applied via an inverting stage.

4. A device as claimed in claim 1, wherein the cathode ray tube device comprises a video display tube and a photo tube, the electron beam of the video display tube being modulated by the difference signal, the photo tube being optically coupled to the display screen of the video display tube, the polarity of the direct voltage applied to the outer electrodes of the photo tube being reversible in accordance with the polarity of the applied difference signal values.

5. A device as calimed in claim 1, wherein said control means comprises a multiplier circuit which multiplies the difference signal by a numerical value which is proportional to the reciprocal value of the length of respective scanning strips on the target.

6. A device as claimed in claim 1, further comprising a zero detector for erasing charges on a strip on the target when the associated primary integral value is zero.

7. A device as claimed in claim 1, wherein an additional store is provided for storing the charge image between two iteration steps, the primary integral values in the first store being replaced by the difference signal values, and the charge image being subsequently erased.

8. A device as claimed in claim 7, further comprising a second multiplier circuit which multiplies the difference signal values read from the first store by an even factor which is larger that 1, a third multiplier circuit being provided for multiplying the signals to be stored in the additional store by the reciprocal value of this factor.

9. A device as claimed in claim 1, wherein a plurality of groups of primary integral values are derived by scanning the plane of measurement from different directions, said control means adjusting the scanning of the target to the direction of scanning of each group.

* * * * *